United States Patent

Gaylord et al.

[11] Patent Number: 5,849,076
[45] Date of Patent: Dec. 15, 1998

[54] COOLING SYSTEM AND METHOD FOR EPITAXIAL BARREL REACTOR

[75] Inventors: Eric Lee Gaylord, Matthews, N.C.; Charles Herman Mueller, St. Peters, Mo.

[73] Assignee: MEMC Electronic Materials, Inc., St. Peters, Mo.

[21] Appl. No.: 686,565

[22] Filed: Jul. 26, 1996

[51] Int. Cl.⁶ .................................................. C30B 25/10
[52] U.S. Cl. .............................. 117/85; 117/86; 117/201; 117/202; 118/724
[58] Field of Search ............................... 117/85, 86, 201, 117/202; 118/724

[56] References Cited

U.S. PATENT DOCUMENTS

| | | | |
|---|---|---|---|
| 4,579,080 | 4/1986 | Martin et al. | 118/724 |
| 5,314,541 | 5/1994 | Saito et al. | 118/724 |
| 5,364,488 | 11/1994 | Minato et al. | 118/724 |
| 5,578,132 | 11/1996 | Yamaga et al. | 118/724 |

OTHER PUBLICATIONS

Barrel Reactor Cooling System (written description) No Date.

*Primary Examiner*—Robert Kunemund
*Attorney, Agent, or Firm*—Senniger, Powers, Leavitt & Roedel

[57] ABSTRACT

Barrel reactor apparatus for chemical vapor deposition of a material on a semiconductor wafer having a cooling system which protects the semiconductor wafers from metals contamination caused by degradation of metallic surfaces of the barrel reactor. Degradation is caused by water reacting with other substances (e.g., HCl) in the barrel reactor. The cooling system has a controller which monitors the operational state of the barrel reactor and selects an operating setpoint based on the detected operational condition. As a result, the metallic surfaces of the barrel reactor are kept cool during operation to retard corrosive chemical reaction rates, and kept warmer than would be otherwise possible when the barrel reactor is not operating to prevent adsorption of water by and condensation of water onto the metallic surfaces.

13 Claims, 3 Drawing Sheets

५,८४९,०७६

COOLING SYSTEM AND METHOD FOR EPITAXIAL BARREL REACTOR

BACKGROUND OF THE INVENTION

This invention relates generally to epitaxial barrel reactors and more specifically to a cooling system and method for a barrel reactor which inhibits metals contamination.

Barrel reactors of the type to which the present invention generally relates are used for deposition of epitaxial layers on semiconductor wafers. Epitaxy is an important process in the semiconductor material industry for achieving the necessary electrical properties of the semiconductor material. For example, a lightly doped epitaxial layer grown over a heavily doped substrate permits a CMOS device to be optimized for latch up immunity as a result of low resistance of the substrate. Other advantages, such as precise control of the dopant concentration profile and freedom from oxygen are also achieved.

Gas carrying the material (e.g., silicon) to be deposited on the wafers is injected into a reaction chamber vessel of the barrel reactor where the deposition of the silicon onto the wafers is accomplished. The process is carried out at elevated temperatures necessary to achieve deposition of silicon from a vapor entrained in the gas onto the wafers. Multiple wafers are held in a generally vertical orientation on walls of a susceptor so that one face of the wafer is exposed for deposition of silicon. The reaction chamber vessel is typically made of quartz. A stainless steel seal plate closes the reaction chamber, but can be moved to open the chamber for inserting or removing semiconductor wafers from the chamber. A gas ring between the seal plate and reaction chamber is also made of stainless steel.

It is important that the layer of silicon deposited on the wafers not be contaminated with metals, such as iron (Fe), nickel (Ni) and molybdenum (Mb), which can deleteriously affect the minority carrier lifetime of the epitaxial layer. The quartz reaction chamber vessel will not be a source of metals contamination, but the stainless steel in the seal plate and gas ring does provide a source for metals contamination. Contact with certain byproducts (e.g., HCl) of the reactant gas in the presence of residual moisture can cause the stainless steel to corrode. Moisture is adsorbed on the stainless steel when the barrel reactor is opened and the stainless steel comes into contact with water vapor in the ambient air. Corrosive agents such as HCl may also be present in the chamber as a result of its use to etch back deposits of silicon from the susceptor. Corrosion products from the stainless steel may be transported into the reaction chamber and become entrained with the reactant gas and silicon deposited on the wafers.

To avoid contamination from the seal plate and gas ring, the barrel reactor is constructed to divert the flow of reactant gas away from the seal plate and gas ring by baffles and by a flow of purge gas over the areas of the seal plate and gas ring exposed to the reactant gas. The barrel reactor, including specifically its seal plate and gas ring, is water cooled. Cooling the seal plate prevents warpage of the seal plate. In addition, removing heat from the metallic surfaces of the seal plate and gas ring which are exposed to the reaction chamber during operation of the barrel reactor retards the rate of undesirable chemical reaction causing the release of atomic Fe from the stainless steel. However, when the barrel reactor is not operating and the seal plate is moved to open the reaction chamber vessel, the relatively cool temperatures of the stainless steel seal plate and gas ring result in adsorption of water molecules on the stainless steel. In addition, by-products of the deposition process, including solid silicon-containing compounds, may be present on the surface of the stainless steel and can also adsorb (as well as absorb) water. In some instances the temperature of the cooling water drops below the dew point in the room and condensation of water from the air onto the seal plate and gas ring occurs. Water is one of the components in the chemical reaction causing release of atomic Fe. The more water on the stainless steel surfaces, the more widespread the chemical reactions. Thus although cooling the stainless steel surfaces during operation of the barrel reactor retards the rate of reaction and therefore the rate of release of atomic Fe, the extent of the reaction is so significant that measurable amounts of atomic Fe are still released.

It is known that the amount of adsorption of water from the ambient air by the stainless steel is highly dependent upon the temperature of the steel. Attempts have been made to reduce the amount of adsorption by increasing the temperature of the stainless steel surfaces. Water at a higher temperature is circulated through the seal plate and gas ring by a cooling system. However, there is an upper limit for the cooling water temperature (about 75° F.). At temperatures above the upper limit damage to the barrel reactor would occur because of insufficient heat removal by the cooling system during operation of the barrel reactor. As a practical matter, a sensor within the barrel reactor would detect temperatures exceeding a limit and shut down the reactor before damage occurred. Thus, the benefit of employing elevated cooling water temperatures to reduce water adsorption is limited in the prior art by the upper limit which is placed on the temperature of the cooling water necessary to cool the barrel reactor during operation.

Operation of the cooling system at higher temperatures has another drawback. The elevated temperature of the metallic surfaces of the seal plate and gas ring during operation of the barrel reactor increases the rate of the chemical reaction which releases atomic Fe. The effectiveness of the cooling system to retard reactions releasing metals into the barrel reactor during its operation is therefore somewhat compromised by the effort to reduce water adsorption. Thus, there is presently a trade off between retarding chemical reactions which release metals, and the avoidance of water adsorption by metallic surfaces in the barrel reactor.

SUMMARY OF THE INVENTION

Among the several objects and features of the present invention may be noted the provision of a barrel reactor and method of operation which substantially inhibit metals contamination of semiconductor wafers processed in the barrel reactor; the provision of such a barrel reactor and method which reduce the rate of those chemical reactions on metallic surfaces of the barrel reactor during operation which release metals into the barrel reaction chamber; the provision of such a barrel reactor and method which reduces the amount of water adsorbed by the metallic surfaces of the barrel reactor when it is not operating and the surfaces are exposed to room air; the provision of such a barrel reactor and method which do not require a trade off between reducing the chemical reaction rate during operation and reducing water adsorption when the barrel reactor is not operating; the provision of such a barrel reactor and method which extend the range of functional temperatures of a cooling system of the barrel reactor; and the provision of such a barrel reactor and method which are cost efficient to use.

Generally, a barrel reactor of the present invention comprises a vessel having an open top for receiving wafers into a reaction chamber defined by the vessel, and a heater for heating the reaction chamber to achieve conditions in the reaction chamber in which the material from a gas deposits on wafers. A gas ring disposed generally around the open top of the vessel is constructed for delivery of the gas including the material to be deposited on the wafers into the reaction chamber. A seal plate is mounted for selectively opening and sealingly closing the open top of the vessel. At least one of the gas ring and the seal plate have a metallic surface exposed to the reaction chamber when the seal plate sealingly closes the open top of the vessel. A cooling system for circulating a coolant fluid to transfer heat between at least one of the gas ring and seal plate and the coolant fluid comprises means for transferring heat between the coolant fluid and another heat transfer medium. A coolant loop in heat exchange relation with the heat transfer means and the metallic surface of the barrel reactor extends from the heat transfer means to at least one of the seal plate and gas ring and back to the heat transfer means for delivering coolant fluid from the heat transfer means and returning coolant fluid from the barrel reactor to the heat transfer means. A sensor detects whether the barrel reactor is in a condition of operating or not operating and generates a signal corresponding to the detected operational condition of the barrel reactor. A controller for controlling the amount of heat transferred at the heat transfer means between the coolant fluid and the other heat transfer medium is configured to control the heat transfer means to transfer heat between the coolant fluid and the other medium to achieve a first setpoint temperature of the coolant fluid selected to retard chemical reaction rates on the metallic surface exposed to the reaction chamber when the seal plate sealingly closes the open top of the vessel, and configured to control the heat transfer means to achieve a second setpoint temperature of the coolant fluid higher than the first setpoint temperature selected to inhibit adsorption of water on the metallic surface when the seal plate is opened. The controller is in communication with the sensor for receiving the signal to control the heat transfer means to achieve the first setpoint temperature of the coolant fluid when the barrel reactor is operating and to control the heat transfer means to achieve the second setpoint temperature of the coolant fluid when the barrel reactor is not operating.

A method of the present invention for operating a barrel reactor inhibits metals contamination in semiconductor wafers processed in the barrel reactor caused by chemical reactions with metallic surfaces of the barrel reactor. Generally, the method comprises the step of opening the barrel reactor to place semiconductor wafers on which material is to be deposited by chemical vapor deposition into a reaction chamber of the barrel reactor. The reaction chamber is sealed and the barrel reactor activated to deliver gas including the material to be deposited on the wafers into the reaction chamber. Heat transferred when the barrel reactor is activated between the metallic surfaces of the barrel reactor which are exposed to the reaction chamber when the reaction chamber is sealed and a coolant fluid is controlled to maintain the metallic surfaces at a first temperature selected to retard chemical reactions on the metallic surfaces. The barrel reactor is de-activated and opened to expose wafers in the reaction chamber for removal from the barrel reactor. Heat transferred when the barrel reactor is de-activated between the metallic surfaces of the barrel reactor which are exposed to the reaction chamber when the reaction chamber is sealed and the coolant fluid is controlled to maintain the metallic surfaces at a second temperature greater than the first temperature. The second temperature is selected to retard adsorption of water on the metallic surfaces while the barrel reactor is de-activated.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
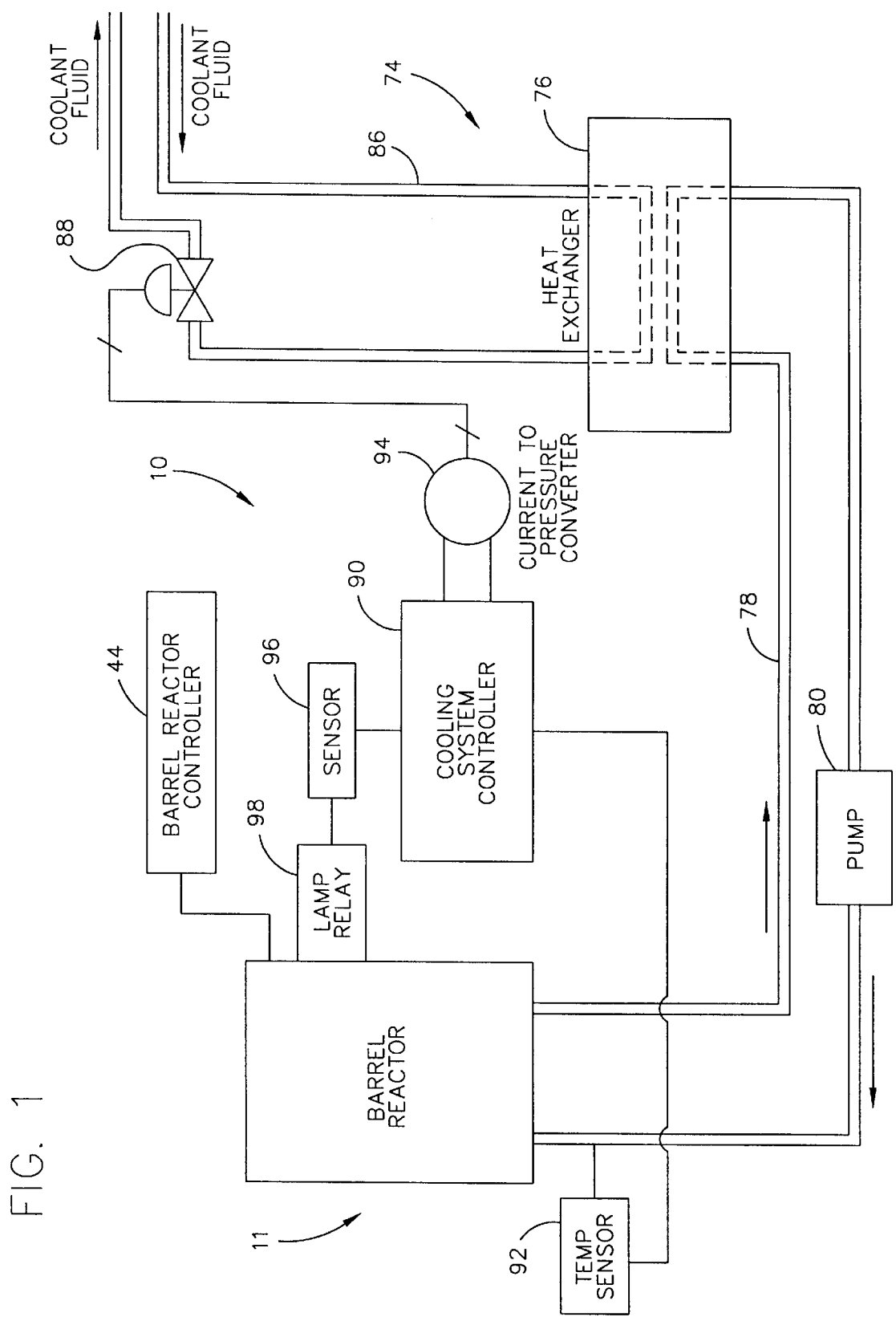
FIG. 1 is a diagrammatic view of a barrel reactor and cooling system thereof of the present invention.
Figure 2:
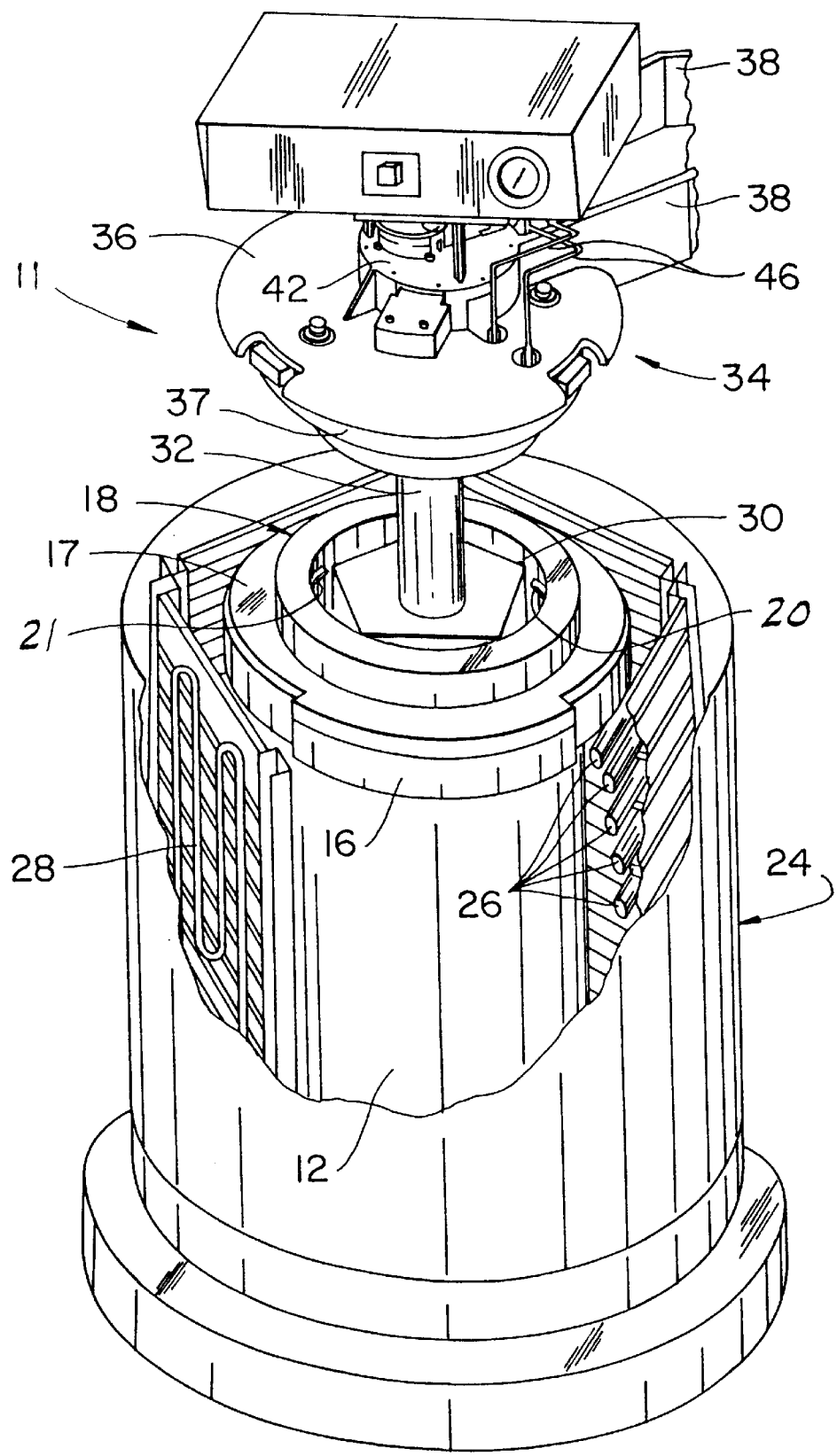
FIG. 2 is a schematic perspective view of the barrel reactor with portions broken away to show internal construction.
Figure 3:
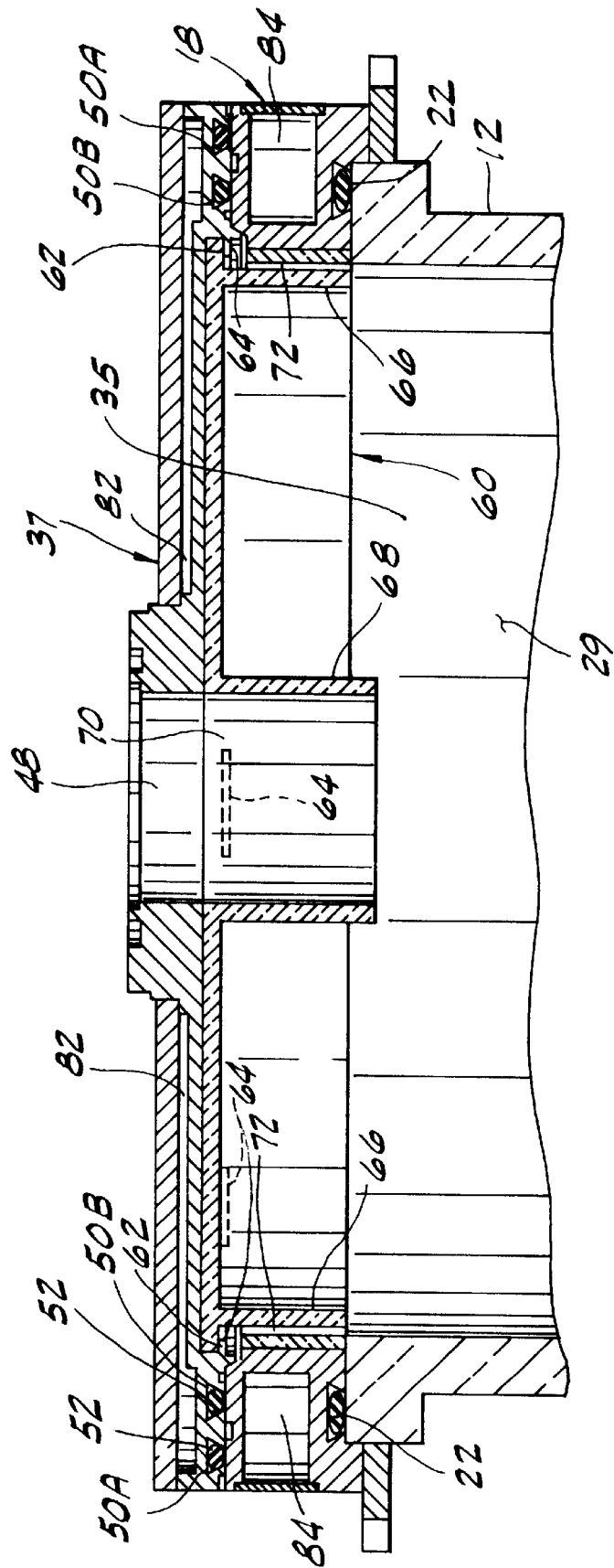
FIG. 3 is an enlarged, fragmentary cross sectional view of a seal plate, gas ring and reaction chamber vessel showing internal passages in the seal plate and gas ring for circulation of cooling fluid.

Referring now to the drawings and in particular to FIGS. 1–3, barrel reactor apparatus, for use in chemical vapor deposition of a layer of material (e.g., silicon) on one face of wafers made of semiconductor material, is generally indicated at 10. The barrel reactor apparatus comprises a barrel reactor 11 including a reaction chamber vessel 12 in the form of an inverted quartz bell jar. A gas ring, generally indicated at 18, at least partially houses a first nozzle 20 and a second nozzle 21 for introduction into the reaction chamber vessel 12 of a gas composed of a reactant vapor which is to be decomposed for deposition on the wafers, and a carrier. The gas ring 18 is located at the top of the reaction chamber vessel 12 and sealed therewith by an O-ring 22. The reaction chamber vessel 12 is formed with an exhaust port (not shown) in its bottom through which spent gas is exhausted. A housing indicated generally at 24 contains the reaction chamber vessel 12, and also radiant heat lamps 26 and heat exchangers 28 for controlling the heat applied to a reaction chamber 29 defined by the reaction chamber vessel, the gas ring 18 and the seal plate 37 (FIG. 3).

A silicon-coated graphite susceptor (indicated generally at 30) is hung by a quartz hanger 32 from a lift assembly (indicated generally at 34) capable of lowering the susceptor into the reaction chamber vessel 12 and raising it out of the reaction chamber vessel through its open top 35. In the illustrated embodiment, the susceptor 30 has five generally vertical walls, but the number of walls may be other than five without departing from the scope of the present invention. The susceptor 30 has vertically arranged recesses (not shown) in each wall, each of which is sized and shaped to hold a semiconductor wafer of a particular diameter. The walls of the susceptor slope back slightly toward the top of the susceptor for holding the wafers in the recesses.

The lift assembly 34 includes a cap 36 supporting a seal plate 37 sealingly engageable with the gas ring 18 for sealing the reaction chamber 29, and lift arms 38 connected to the cap for raising and lowering the cap. A drive assembly 42 for rotating the susceptor 30 about its longitudinal axis is located on top of the cap 36. A barrel reactor controller 44 (FIG. 1) controls the operation of the drive assembly 42 and other functions of the barrel reactor 11. Various purge gas lines deliver purge gas into the barrel reactor 11 to keep the injected gas away from metallic surfaces and other parts exposed to the reaction chamber 29 during operation of the barrel reactor. For example, purge gas lines 46 connected through the cap 36 deliver purge gas generally through the center of the susceptor 30. The construction of the barrel reactor apparatus 10, with the exception of a cooling system (described hereinafter) for cooling the gas ring 18 and seal plate 37, and the susceptor 30 are well known to the semiconductor material producing industry. Accordingly, only a general description of their features and operation are given herein.

The seal plate 37, gas ring 18 and fragmentary portion of the reaction chamber vessel 12 are shown in cross section in FIG. 3 with the seal plate in its closed position. All other components of the barrel reactor 11, including the lift assembly 34, hanger 32 and susceptor 30 have been removed. It may be seen that the seal plate 37 has a central opening 48 through which the susceptor 30 is attached by the hanger 32 to the drive assembly 42. The seal plate 37 has an annular surface which overlies a corresponding surface of the gas ring 18 when the seal plate is in its closed position. A pair concentric annular channels (designated 50A and 50B, respectively) in the seal plate 37 contain O-rings 52 which engage the gas ring 18 in the closed position for sealing with the gas ring and isolating the reaction chamber 29 from the surrounding environment.

A quartz baffle plate indicated generally at 60 has a lip 62 which rests on tabs 64 on the seal plate 37. The baffle plate 60 substantially covers the underside of the stainless steel seal plate 37 and minimizes exposure of the stainless steel to the gases in reaction chamber 29. An annular outer baffle 66 depends from the baffle plate 60 at a location inward of the perimeter of the baffle plate, and an annular inner baffle 68 depends from the baffle plate around a central opening 70 generally in registration with the central opening 48 of the seal plate 37. The inner baffle 68 helps to protect the hanger 32 connecting the susceptor 30 to the drive assembly 42 (FIG. 1). The radially inner face of the gas ring 18 is covered by a quartz ring 72. The baffle plate 60 and the quartz ring 72 have openings (not shown) through which reactant gas is injected into the reaction chamber 29 from the first and second nozzles 20, 21. Although the baffles 60, 72 do provide substantial protection for the stainless steel surfaces of the gas ring 18 and seal plate 37, they do not entirely prevent these surfaces from being exposed to (in the sense of being in fluid communication with) the interior of the reaction chamber 29 when the seal plate sealingly closes the open top 35 of the reaction chamber vessel 12 and the barrel reactor 11 is activated. Gases including components reactive with water to release contaminating metals still come into contact with the stainless steel surfaces. The purge gas is also not entirely effective in preventing the gas from coming into contact with the stainless steel surfaces.

Referring now to FIG. 1, a cooling system 74 of the present invention for cooling the gas ring 18 and seal plate 37 is shown to comprise a heat exchanger 76 and a first cooling loop 78 extending from the heat exchanger to the barrel reactor 11, and back to the heat exchanger in a closed circuit. At the barrel reactor 11 the first cooling loop 78 has multiple branches, one of which extends through the gas ring 18 and seal plate 37 and another of which extends to the heat exchangers 28 (FIG. 2). Heated coolant fluid from all of the branches returns to the heat exchanger 76 through the same pipe of the first cooling loop 78. A pump 80 in the first cooling loop 78 circulates chilled coolant fluid (e.g., water) to the barrel reactor 11 and returns heated coolant fluid back to the heat exchanger 76 to withdraw heat from the metallic surfaces of the gas ring 18 and seal plate 37. The subsequent discussion of the first loop 78 herein will be confined to the loop including that branch which extends to the gas ring 18 and seal plate 37. As shown in FIG. 3, the seal plate has an internal annular passage 82 through which coolant fluid is circulated to cool the seal plate. A similar passage 84 is formed in the gas ring 18 for the purpose of circulating the coolant fluid. The passages 82, 84 are part of the first cooling loop 78 in the illustrated embodiment.

A second cooling loop 86 containing another coolant medium (also typically water) is in thermal communication with the coolant fluid in the first cooling loop 78 in the heat exchanger 76. Heat transferred from the gas ring 18 and seal plate 37 to the coolant fluid in the first loop 78 is transferred to the coolant fluid in the second loop 86 in the heat exchanger 76. The second cooling loop 86 extends in a circuit from the heat exchanger 76 through a valve 88 to a source (not shown) of chilled water or other coolant fluid and back to the heat exchanger. In the preferred embodiment, the heat exchanger 76 and the second cooling loop 86 constitute "heat transfer means". The source of chilled water may be a conventional water chiller employing a vapor compression refrigeration system or another suitable heat sink. Although the first and second cooling loops 78, 86 are closed loops in the preferred embodiment, the first loop or the second loop may be open. If the first loop were open, the second loop and heat exchanger would not be present. In that event, the heat transfer means would constitute the source of coolant fluid for the first loop.

The valve 88 is a selectively variable position valve controlled by a PID cooling system controller 90 to regulate the flow of coolant fluid in the second cooling loop 86 and thereby the amount of heat which is transferred from the coolant fluid in the first cooling loop 78. The controller 90 is connected to a temperature sensor 92 sensing the temperature of the coolant fluid in the first cooling loop 78 as it leaves the heat exchanger 76. The controller 90 modulates the valve 88 in response to the sensed temperature to maintain the coolant fluid in the first loop 78 at a selected setpoint temperature. More specifically, the controller 90 provides a signal in the range of 4 to 20 mA, according to whether more or less cooling of the coolant fluid is required, to a current to pressure converter 94 which converts the current signal to a pneumatic signal of between 3 and 15 PSIG. The valve 88 operates in response to the pneumatic signal received to move itself to the selected position. It is to be understood that other types of valves (not shown), for example a solenoid valve operating directly from an electronic signal, could be used without departing from the scope of the present invention.

To achieve both retardation of chemical reaction on the stainless steel surfaces of the gas ring 18 and seal plate 37 when the barrel reactor 11 is active, and prevention of adsorption and condensation of water from the air onto these stainless steel surfaces when the barrel reactor is inactive, the controller 90 is configured to operate the cooling system 74 at two different coolant fluid setpoint temperatures. A sensor 96 detects the operational condition of the barrel reactor 11 by detecting whether a lamp relay 98 used to energize and de-energize the heat lamps 26 in the barrel reactor is opened or closed. The sensor 96, which may be a simple electrical circuit which is either opened or closed along with the lamp relay 98, is in communication with the controller 90 and signals the operating condition of the barrel reactor 11 to the controller. It is to be understood that a sensor might detect something else besides the energization state of the lamps 26 to determine the operating condition of the barrel reactor 11 (e.g., whether the seal plate 37 is opened or closed) without departing from the scope of the present invention. Based on the signal received from the sensor 96, the controller 90 operates at a different setpoint for cooling the coolant fluid to the barrel reactor 11.

The controller 90 modulates the valve 88 to cool the water to a first setpoint temperature when it receives a signal from the sensor 96 that the lamps 26 are active and the barrel reactor 11 is in operation. The first setpoint temperature is selected to retard chemical reaction rates on the metallic surfaces of the gas ring 18 and seal plate 37 while the barrel reactor 11 is operating. The heat from the lamps 26 provides a source of energy to heat reactor components, including the gas ring 18 and seal plate 37, and drive reactions which result in the release of contaminant metals such as atomic Fe. It is this heat which the cooling system 74 operates to remove from the gas ring 18 and seal plate 37. In the preferred embodiment, the temperature of the coolant fluid entering the barrel reactor 11 is maintained at about 50° F.±2° when the controller 90 is operating at the first setpoint temperature. However, lower coolant fluid temperatures may be used. For example, when the coolant fluid is water, temperatures into the 40° F. range have been employed while the barrel reactor 11 is active.

When the controller 90 receives a signal from the sensor 96 that the heat lamps 26 are de-energized, it switches to operating the cooling system 74 at a second setpoint temperature for the coolant fluid entering the barrel reactor 11. In the preferred embodiment, the second setpoint temperature of the coolant fluid is 86° F.±2°. It has been found that adsorption of water by the stainless steel of the gas ring 18 and seal plate 37 is greatly reduced when the coolant fluid is allowed to rise to this temperature. At the second setpoint temperature, the controller 90 throttles down the valve 88 so that the rate of flow of coolant fluid in the second cooling loop 86 is reduced (even to the point of completely shutting off the flow). As a result, less heat is transferred from the coolant fluid in the first cooling loop 78 and the temperature of the coolant fluid rises. The temperature of the metallic surfaces of the gas ring 18 and seal plate 37 rise. It is to be understood that the heat transfer means of the present invention could alternatively add heat to the coolant fluid in the first loop 78 to achieve the second setpoint temperature without departing from the scope of the present invention.

Having described the general construction of the barrel reactor apparatus 10, its operation will now be described. The susceptor 30 is loaded with semiconductor wafers on which a layer of silicon or other material is to be deposited by chemical vapor deposition. The seal plate 37 is raised to expose the open top 35 of the reaction chamber vessel 12 and the susceptor 30 is hung on the hanger 32 attached to the seal plate. The susceptor 30 is lowered into the reaction chamber vessel 12 of the reactor by the lift assembly 34 which simultaneously lowers the seal plate 37 into sealing engagement with the gas ring 18 (as shown in FIG. 3) to seal the interior of the reaction chamber vessel 12. The environment in the reaction chamber vessel 12 is purged of oxygen and the heat lamps 26 are activated.

The controller 44 activates the drive assembly 42 to begin rotation of the susceptor 30. As is conventional, the controller 44 monitors the temperature of the atmosphere within the barrel reactor 11. If the controller 44 detects a temperature in excess of a maximum operating temperature, the controller de-activates the barrel reactor 11 (and in particular the lamps 26) to prevent damage to the barrel reactor. In presently existing barrel reactors, the maximum operating temperature will not be exceeded if the coolant fluid supplied to the barrel reactor is maintained at or below a maximum coolant fluid temperature. In the case where water is the coolant fluid, the maximum coolant fluid temperature during operation of the barrel reactor 11 is about 75° F.

Flow of reactant vapor and carrier gas is initiated so that the first and second nozzles 20, 21 emit streams of gas into the reaction chamber vessel 12. Although the flow of gas injected into the reaction chamber vessel 12 is complex, it is generally understood that the streams of gas emitted from the first and second nozzles 20, 21 collide, travel down the back side (as seen from the vantage of FIG. 2) of the reaction chamber vessel 12 and then up the front side. Eventually, the gas exits through the exhaust port in the bottom of the reaction chamber vessel 12. The reactant vapor carried by the carrier gas decomposes into gaseous silicon and by-products in the environment of the reaction chamber vessel 12. The silicon is then deposited on the exposed faces of the wafers.

Activation of the lamps 26 (by the closing of relay 98) is detected by sensor 96 which transmits a signal to the cooling system controller 90 that the barrel reactor 11 is activated. Upon receiving the signal that the barrel reactor is activated, the controller 90 resets to operate the cooling system 74 at the first setpoint temperature to transfer heat from the metallic surfaces of the gas ring 18 and seal plate 37 which are exposed to the interior of the reaction chamber vessel 12 during operation. The temperature signal from the sensor 92 measuring the temperature of the coolant fluid in the first cooling loop 78 will ordinarily be higher than the first setpoint temperature (e.g. 50° F.±2°). Accordingly, the controller 90 sends a signal to the converter 94 in the form of a electric current in the range of 4 to 20 mA, which is indicative of the position of the valve 88 needed to remove more heat from the coolant fluid in the first cooling loop 78. The current to pressure converter 94 changes the current signal to a corresponding pressure signal which is transmitted to the valve 88 in the second cooling loop 86.

The pressure signal from the converter 94 causes the valve 88 to move to a more open position so that the rate of flow of coolant fluid around the second loop 86 and through the heat exchanger 76 increases. The coolant fluid in the second loop 86 begins removing additional heat from the coolant fluid in the first loop 78 causing its temperature to drop. As the lamps 26 continue to heat up the interior of the barrel reactor, the temperature of the coolant fluid in the first loop may continue to rise resulting in further opening of the valve 88 by the controller 90. Some small modulations may occur, but eventually the controller 90 settles in on a substantially steady state operating position of the valve 88. The conventional PID control algorithm employed by the controller 90 minimizes the modulations and speeds the reaction to any substantial changes in coolant fluid temperature in the first loop 78.

At the end of the deposition cycle, the controller 44 trips the heating lamp relay 98 to de-energize the lamps 26. The sensor 96 detects the deactivated condition of the barrel reactor 11 and signals the cooling system controller 90, causing the controller to reset its operating setpoint to the second setpoint temperature (e.g., 86° F.+2°). The temperature of the coolant fluid in the first cooling loop 78 detected by the temperature sensor 92 is substantially below the second setpoint temperature so that the controller 90 now signals the valve 88 to move to a more (or completely) closed position, restricting the rate of flow of coolant fluid around the second cooling loop 86. The coolant fluid in the second loop 86 flowing at a reduced flow rate through the heat exchanger 76 transfers less heat from the coolant fluid in the first loop 78 causing its temperature to rise toward the second setpoint temperature. The temperature rise is a result of the residual heat of the de-energized heat lamps 26 in the barrel reactor 11 which is transferred to the coolant fluid in the first loop 78. Although the heating of the metallic surfaces of the gas ring 18 and seal plate 37 is accomplished passively in the preferred embodiment, the positive application of heat, such as by a heater (not shown) at the heat exchanger 76 or by heating the water in the second cooling loop 86, would also fall within the scope of the present invention.

The first and second nozzles 20, 21 are shut off when the deposition cycle is completed. After suitable purging operations are carried out within the reaction chamber 29, the seal plate 37 is raised to open the barrel reactor 11 and to lift the susceptor 30 at least partially out of the reaction chamber vessel 12. The metallic surfaces of the gas ring 18 and seal plate 37 which were exposed to the reaction chamber 29 when the seal plate closed the reaction chamber are now exposed to room air. The elevated temperatures of the stainless steel gas ring 18 and seal plate 37 inhibit adsorption of water by the stainless steel. Thus, the cooling system 74 of the present invention is capable of both optimally retarding chemical reaction rates when the barrel reactor 11 is active, and inhibiting adsorption and preventing condensation of water onto the gas ring 18 and seal plate 37 when the barrel reactor is inactive. Neither the effectiveness of the chemical reaction rate retardation or the effectiveness of the adsorption and condensation prevention is compromised with the barrel apparatus 10 including the cooling system 74 of the present invention. Moreover, the temperature of the coolant fluid circulated to the barrel reactor 11 when it is inactive may exceed the maximum coolant fluid temperature permissible during operation of the barrel reactor to better inhibit adsorption of water.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Barrel reactor apparatus for chemical vapor deposition of a material on a semiconductor wafer, the barrel reactor apparatus comprising:
    a barrel reactor including,
        a vessel having an open top for receiving wafers into a reaction chamber defined by the vessel,
        a heater for heating the reaction chamber to achieve conditions in the reaction chamber in which the material from a gas deposits on wafers,
        a gas ring disposed generally around the open top of the vessel, the gas ring being constructed for delivery of the gas including the material to be deposited on the wafers into the reaction chamber,
        a seal plate mounted for selectively opening and sealingly closing the open top of the vessel,
        at least one of the gas ring and the seal plate having a metallic surface exposed to the reaction chamber when the seal plate sealingly closes the open top of the vessel; and
    a cooling system for circulating a coolant fluid to transfer heat between at least one of the gas ring and seal plate and the coolant fluid, the cooling system comprising,
        means for transferring heat between the coolant fluid and another heat transfer medium,
        a cooling loop in heat exchange relation with said heat transfer means and the metallic surface of the barrel reactor, the cooling loop extending from said heat transfer means to at least one of said seal plate and gas ring and back to said heat transfer means for delivering coolant fluid from said heat transfer means and returning coolant fluid from the barrel reactor to said heat transfer means,
        a sensor for detecting whether the barrel reactor is in a condition of operating or not operating and generating a signal corresponding to the detected operational condition of the barrel reactor,
        a controller for controlling the amount of heat transferred at said heat transfer means between from the coolant fluid and said other heat transfer medium, the controller being configured to control said heat transfer means to transfer heat between the coolant fluid and said other medium to achieve a first setpoint temperature of the coolant fluid selected to retard chemical reaction rates on the metallic surface exposed to the reaction chamber when the seal plate sealingly closes the open top of the vessel, and configured to control said heat transfer means to achieve a second setpoint temperature of the coolant fluid higher than the first setpoint temperature selected to inhibit adsorption of water by the metallic surface when the seal plate is opened,
        the controller being in communication with the sensor for receiving the signal to control said heat transfer means to achieve the first setpoint temperature of the coolant fluid when the barrel reactor is operating and to control said heat transfer means to achieve the second setpoint temperature of the coolant fluid when the barrel reactor is not operating.

2. Barrel reactor apparatus as set forth in claim 1 wherein said heat transfer means is constructed to remove heat from the coolant fluid in the cooling loop.

3. Barrel reactor apparatus as set forth in claim 2 wherein the cooling loop of the coolant system comprises a first cooling loop and wherein said heat transfer means comprises a second cooling loop containing a coolant fluid, the second cooling loop being in thermal communication with the first cooling loop for removing heat from the coolant fluid in the first cooling loop, a valve in the second cooling loop for selectively controlling the flow of coolant fluid in the second loop thereby to control the amount of heat transferred from the coolant fluid in the first cooling loop to the coolant fluid in the second cooling loop, the valve being in communication with the controller and controlled by the controller to achieve the first and second setpoint temperatures.

4. Barrel reactor apparatus as set forth in claim 3 wherein the sensor detects whether the heater is active or inactive, the sensor sending the signal to the controller that the barrel reactor is not operating when the heater is inactive and sending the signal to the controller that the barrel reactor is operating when the heater is active.

5. Barrel reactor apparatus as set forth in claim 1 wherein the sensor detects whether the heater is active or inactive, the sensor sending the signal to the controller that the barrel reactor is not operating when the heater is inactive and sending the signal to the controller that the barrel reactor is operating when the heater is active.

6. Barrel reactor apparatus as set forth in claim 1 further comprising a barrel reactor controller adapted to monitor the interior temperature of the barrel reactor when the barrel reactor is operating, the barrel reactor controller being configured to cease operation of the barrel reactor if the monitored temperature exceeds a maximum operating temperature, the maximum operating temperature corresponding to a maximum cooling fluid temperature, and wherein the second setpoint temperature of the cooling system controller is greater than the maximum cooling fluid temperature allowed when the barrel reactor is activated.

7. A method for operating a barrel reactor to inhibit metals contamination in semiconductor wafers processed in the barrel reactor caused by chemical reactions with metallic surfaces of the barrel reactor, the method comprising the steps of:

opening the barrel reactor to place semiconductor wafers on which material is to be deposited by chemical vapor deposition into a reaction chamber of the barrel reactor;

sealing the reaction chamber;

activating the barrel reactor to deliver gas including the material to be deposited on the wafers into the reaction chamber;

transferring heat, when the barrel reactor is activated, between the metallic surfaces of the barrel reactor which are exposed to the reaction chamber when the reaction chamber is sealed and a coolant fluid;

controlling the heat transferred to maintain the metallic surfaces at a first temperature selected to retard chemical reactions on the metallic surfaces while the barrel reactor is activated;

de-activating the barrel reactor;

opening the barrel reactor to expose wafers in the reaction chamber thereof for removal from the barrel reactor;

transferring heat when the barrel reactor is de-activated, between the metallic surfaces of the barrel reactor which are exposed to the reaction chamber when the reaction chamber is sealed and the coolant fluid;

controlling the heat transferred to maintain the metallic surfaces at a second temperature greater than the first temperature when transferring heat while the barrel reactor is de-activated, the second temperature being selected to retard adsorption of water on the metallic surfaces while the barrel reactor is de-activated.

8. A method for operating a barrel reactor as set forth in claim 7 wherein said heat transferring steps are accomplished by a cooling system circulating the coolant fluid, the cooling system including a controller for controlling the heat transferred from the metallic surfaces, and wherein the said heat transfer steps comprise the steps of:

operating the controller at a first setpoint to control the transfer of heat between the metallic surfaces and coolant fluid in the cooling system when the barrel reactor is activated; and operating the controller at a second setpoint greater than the first setpoint to control the transfer of heat between the metallic surfaces and coolant fluid in the cooling system when the barrel reactor is de-activated.

9. A method for operating a barrel reactor as set forth in claim 8 further comprising the steps of:

detecting whether the barrel reactor is operating by detecting whether a heater in the barrel reactor is energized;

signalling the controller to operate at the first setpoint if the heater is energized;

signalling the controller to operate at the second setpoint if the heater is not energized.

10. A method for operating a barrel reactor as set forth in claim 9 wherein the cooling system comprises a first cooling loop extending in a circuit from a heat exchanger to the metallic surfaces in the barrel reactor; and a second cooling loop in thermal communication with the first cooling loop at the heat exchanger, the second cooling loop containing a coolant fluid therein, and wherein:

the step of operating the controller at a first setpoint comprises permitting coolant fluid in the second cooling loop to flow generally at a first rate through the second cooling loop;

the step of operating the controller at the first setpoint comprises permitting coolant fluid in the second cooling loop to flow through the second cooling loop generally at a second rate less than the first rate.

11. A method as set forth in claim 10 wherein the steps of operating the controller at the first and second setpoints further comprise controlling a valve in the second cooling loop.

12. A method as set forth in claim 8 further comprising the steps of:

monitoring the interior temperature of the barrel reactor and de-activating the barrel reactor if the monitored temperature exceeds a maximum operation temperature generally corresponding to a maximum coolant fluid temperature capable of transferring heat to maintain the interior of the barrel reactor at or below the maximum operation temperature;

and wherein the step of operating the controller at a second setpoint comprises the step of operating the controller controlling the heat transferred to maintain the coolant fluid at a temperature higher than the maximum coolant fluid temperature allowed when the barrel reactor is activated.

13. A barrel reactor constructed to inhibit metals contamination in semiconductor wafers processed in the barrel reactor caused by chemical reactions with metallic surfaces of the barrel reactor, the barrel reactor comprising:

means for opening the barrel reactor to place semiconductor wafers on which material is to be deposited by chemical vapor deposition into a reaction chamber of the barrel reactor;

means for sealing the reaction chamber;

means for activating the barrel reactor to deliver gas including the material to be deposited on the wafers into the reaction chamber;

means for transferring heat, when the barrel reactor is activated, between the metallic surfaces of the barrel reactor which are exposed to the reaction chamber when the reaction chamber is sealed and a coolant fluid;

means for controlling the heat transferred to maintain the metallic surfaces at a first temperature selected to retard chemical reactions on the metallic surfaces while the barrel reactor is activated;

said activating means being capable of de-activating the barrel reactor;

said opening means being capable of opening the barrel reactor to expose wafers in the reaction chamber thereof for removal from the barrel reactor;

said heat transferring means being capable, when the barrel reactor is de-activated, of transferring heat between the metallic surfaces of the barrel reactor which are exposed to the reaction chamber when the reaction chamber is sealed and the coolant fluid;

said controlling means being configured to control the heat transferred when the barrel reactor is de-activated to maintain the metallic surfaces at a second temperature greater than the first temperature, the second temperature being selected to retard adsorption of water by the metallic surfaces while the barrel reactor is de-activated.

* * * * *